(12) United States Patent
Pinos et al.

(10) Patent No.: US 12,402,439 B2
(45) Date of Patent: Aug. 26, 2025

(54) STRAIN RELAXATION LAYER

(71) Applicant: PLESSEY SEMICONDUCTORS LTD, Plymouth (GB)

(72) Inventors: Andrea Pinos, Plymouth (GB); WeiSin Tan, Plymouth (GB); Samir Mezouari, Plymouth (GB); John Lyle Whiteman, Plymouth (GB); Xiang Yu, Plymouth (GB); Jun-Youn Kim, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 485 days.

(21) Appl. No.: 18/009,515

(22) PCT Filed: Jul. 14, 2021

(86) PCT No.: PCT/GB2021/051811
§ 371 (c)(1),
(2) Date: Dec. 9, 2022

(87) PCT Pub. No.: WO2022/013556
PCT Pub. Date: Jan. 20, 2022

(65) Prior Publication Data
US 2023/0238479 A1    Jul. 27, 2023

(30) Foreign Application Priority Data
Jul. 16, 2020   (GB) .................................. 2010988.0

(51) Int. Cl.
*H10H 20/815* (2025.01)
*H10H 20/01* (2025.01)
(Continued)

(52) U.S. Cl.
CPC .... *H10H 20/815* (2025.01); *H10H 20/01335* (2025.01); *H10H 20/812* (2025.01);
(Continued)

(58) Field of Classification Search
CPC ........... H10H 20/815; H10H 20/01335; H10H 20/812; H10H 20/817; H10H 20/819;
(Continued)

(56) References Cited

U.S. PATENT DOCUMENTS

| 7,799,699 B2 * | 9/2010 | Nuzzo ................. H01L 21/3083 216/2 |
| 2007/0152353 A1 | 7/2007 | Park |
| 2016/0197151 A1 | 7/2016 | Han et al. |

FOREIGN PATENT DOCUMENTS

| JP | 2007184619 A | 7/2007 |
| WO | 2019063957 A1 | 4/2019 |

OTHER PUBLICATIONS

International Search Report and Written Opinion in PCT International Application No. PCT/GB2021/051811 mailed Nov. 8, 2021.
(Continued)

*Primary Examiner* — David Vu
(74) *Attorney, Agent, or Firm* — Cognition IP, P.C.; Edward Steakley

(57) ABSTRACT

A method of forming a strain relaxation layer in an epitaxial crystalline structure, the method comprising: providing a crystalline template layer comprising a material with a first natural relaxed in-plane lattice parameter; forming a first epitaxial crystalline layer on the crystalline template layer, wherein the first epitaxial crystalline layer has an initial electrical conductivity that is higher than the electrical conductivity of the crystalline template layer; forming a second epitaxial crystalline layer on the first epitaxial crystalline layer, wherein the second epitaxial crystalline layer has an electrical conductivity lower than the initial electrical conductivity of the first epitaxial crystalline layer and comprises a material with a second natural relaxed in-plane lattice parameter that is different to the first natural relaxed in-plane lattice parameter of the crystalline template layer;
(Continued)

forming pores in the first epitaxial crystalline layer by electrochemical etching of the first epitaxial crystalline layer to enable strain relaxation in the second epitaxial crystalline layer by plastic deformation of bonds in the first epitaxial crystalline layer and/or at the interface between the first epitaxial crystalline layer and the second epitaxial crystalline layer; and forming one or more channels comprising a conductive material through at least the first epitaxial crystalline layer and the second epitaxial crystalline layer thereby to enable electrical connection to the crystalline template layer through the first epitaxial crystalline layer and the second epitaxial crystalline layer.

20 Claims, 6 Drawing Sheets

(51) Int. Cl.
*H10H 20/812* (2025.01)
*H10H 20/817* (2025.01)
*H10H 20/819* (2025.01)
*H10H 20/825* (2025.01)

(52) U.S. Cl.
CPC ........ *H10H 20/817* (2025.01); *H10H 20/819* (2025.01); *H10H 20/825* (2025.01)

(58) Field of Classification Search
CPC .. H10H 20/825; H10H 29/011; H10H 29/142; H10H 20/036
See application file for complete search history.

(56) References Cited

OTHER PUBLICATIONS

Pasayat S S, et al., "Compliant micron-sized patterned ingan pseudo-substrates utilizing porous GaN", Materials 20200101 MDPI AG CHE, vol. 13, No. 1, Jan. 4, 2020.

* cited by examiner

STRAIN RELAXATION LAYER

CROSS-REFERENCE TO RELATED APPLICATIONS

This application is a 35 U.S.C. § 371 national stage application of PCT International Application No. PCT/GB2021/051811, filed on Jul. 14, 2021, which claims the benefit of Great Britain Application No. 2010988.0, filed Jul. 16, 2020, which are hereby incorporated by reference in their entirety.

FIELD OF THE INVENTION

The invention relates to a template and a method for forming a template. In particular, but not exclusively, the invention relates to a template and method of forming a template that enables the growth of strain-relaxed crystalline material for practical device formation.

BACKGROUND OF THE INVENTION

Epitaxially grown crystalline devices, such light emitting diode (LED) devices are typically formed using techniques such as metal organic chemical vapour deposition (MOCVD) and molecular beam epitaxy (MBE) in order to provide crystalline structures with layers of varying composition. The varying composition of the layers, which may be necessitated by the desire to achieve particular emissive recombination, for example, can cause mismatches between the crystalline lattice parameters of the layers. Such mismatches can typically lead to high strain, which can in turn lead to a reduction in internal quantum efficiency (IQE). This is a known problem in the formation of indium gallium nitride (InGaN) based LED structures, particularly in cases where high indium content in InGaN quantum wells (QWs) is used to provide longer wavelength light emission, for example red light emission.

In such cases, attempting to reduce the strain in the underlying layer in order to improve the properties of devices often causes further difficulties. For example, in InGaN based devices, growing QWs on a relaxed InGaN layer with a larger in-plane lattice constant than gallium nitride (GaN), will reduce the strain and therefore improve the IQE. However, achieving high quality relaxed InGaN layers, whilst also enabling the carrier injection in the QWs to form functioning devices, is problematic as high quality n-type layers with the preferred doping levels are typically and advantageously formed from n-type doped GaN and are not easily achieved for materials with the composition needed to reduce strain and therefore improve the IQE of red light emitting InGaN based LEDs.

Porous GaN layers have been proposed as a mechanism to reduce strain in subsequently grown layers, as porous GaN is compliant and rich in broken bonds, which allow the propagation of misfit dislocations at the porous GaN/InGaN interfaces. However, such porous GaN is highly resistive and therefore not generally suitable for the formation of functioning devices.

SUMMARY OF THE INVENTION

In order to mitigate for at least some of the above described problems, there is provided: a method of forming a strain relaxation layer in an epitaxial crystalline structure, the method comprising: providing a crystalline template layer comprising a material with a first natural relaxed in-plane lattice parameter; forming a first epitaxial crystalline layer on the crystalline template layer, wherein the first epitaxial crystalline layer has an initial electrical conductivity that is higher than the electrical conductivity of the crystalline template layer; forming a second epitaxial crystalline layer on the first epitaxial crystalline layer, wherein the second epitaxial crystalline layer has an electrical conductivity lower than the initial electrical conductivity of the first epitaxial crystalline layer and comprises a material with a second natural relaxed in-plane lattice parameter that is different to the first natural relaxed in-plane lattice parameter of the crystalline template layer; forming pores in the first epitaxial crystalline layer by electrochemical etching of the first epitaxial crystalline layer to enable strain relaxation in the second epitaxial crystalline layer by plastic deformation of bonds in the first epitaxial crystalline layer and/or at the interface between the first epitaxial crystalline layer and the second epitaxial crystalline layer; and forming one or more channels comprising a conductive material through at least the first epitaxial crystalline layer and the second epitaxial crystalline layer thereby to enable electrical connection to the crystalline template layer through the first epitaxial crystalline layer and the second epitaxial crystalline layer.

There is also provided an epitaxial crystalline structure comprising: a crystalline template layer comprising a material with a first natural relaxed in-plane lattice parameter; a first epitaxial crystalline layer formed on the crystalline template layer; a second epitaxial crystalline layer formed on the first epitaxial crystalline layer, wherein the second epitaxial crystalline layer comprises a material with a second natural relaxed in-plane lattice parameter that is different to the first natural relaxed in-plane lattice parameter of the crystalline template layer; one or more pores formed in the first epitaxial crystalline layer such that any strain in the second epitaxial crystalline layer is relaxed by plastic deformation of bonds in the first epitaxial crystalline layer and/or at the interface between the first epitaxial crystalline layer and the second epitaxial crystalline layer; and one or more channels comprising a conductive material formed through at least the first epitaxial crystalline layer and the second epitaxial crystalline layer thereby to enable electrical connection to the crystalline template layer through the first epitaxial crystalline layer and the second epitaxial crystalline layer.

Advantageously, porosification of an initially high electrical conductivity layer in combination with the formation of one or more channels enables relaxation of a crystalline layer that has a different inherent, relaxed, in-plane lattice parameter compared with the inherent, relaxed, in-plane lattice parameter of an underlying template layer. Such relaxation enables the formation of devices that would otherwise be difficult to achieve, whilst enabling electrical connection with the underlying template layer in a manner that improves device formation.

Preferably, the pores are formed with a density of the volume of the first epitaxial layer between the crystalline template layer and the second epitaxial crystalline layer of greater than 50%, preferably greater than 60% and more preferably greater than 70%. Advantageously, the density of voids in the first epitaxial crystalline layer is controlled in order to facilitate plastic deformation of bonds in the first epitaxial crystalline layer and/or at the interface between the first epitaxial crystalline layer.

Preferably, the second epitaxial crystalline layer comprises at least one V-pit, preferably wherein the depth of the at least one V-pit is substantially the thickness of the first epitaxial crystalline layer and the second epitaxial crystalline layer combined. Advantageously, V-pits of such depth enable electrical connection with the underlying crystalline template layer.

Preferably, the method comprises enlarging the at least one V-pit, preferably wherein enlarging the at least one V-pit comprises etching material from the sidewalls of the at least one V-pit thereby to expose at least a portion of the crystalline template layer. Advantageously, V-pits facilitate electrical connection between the crystalline template layer and layers subsequently formed on the second epitaxial crystalline layer through the porosified, electrically highly resistive porous first epitaxial crystalline layer.

Preferably, the method comprises etching through at least the second epitaxial crystalline layer thereby to form one or more islands in the second epitaxial crystalline layer. Advantageously, the formation of islands controls relaxation of the second epitaxial crystalline layer.

Preferably, the method comprises patterning the second epitaxial crystalline layer, wherein patterning comprises at least one of a lithographic technique and a self-assembled Ni hard mask. Advantageously, patterning the second epitaxial crystalline layer with a self-assembled Ni hard mask enables the formation of narrow channels for strain relaxation and electrical connection with the underlying crystalline template layer.

Preferably, the method comprises forming the crystalline template layer on a patterned template layer. Advantageously, by controlling the underlying morphology of the crystalline template layer, improved device formation is facilitated. Beneficially, the formation of LED devices and arrays of LED devices, such as high resolution micro LED arrays with improved light strain management, more efficient light generation and more efficient light extraction can be provided.

Preferably, the patterned template layer is patterned to provide trenches, preferably wherein forming the crystalline template layer comprises forming overgrowth material in the trenches to provide v-grooves, thereby to enable the formation of two dimensional domains at least partially defined by valleys in the second epitaxial crystalline layer. Advantageously, the formation of trenches enables the size of valleys to be tuned by overgrowth of material in the trenches.

Preferably, the patterned template layer is patterned to provide one or more overgrowth structures, preferably wherein forming the patterned crystalline template layer comprises at least partially masking the crystalline template layer to provide one or more apertures and forming overgrowth material in the one or more apertures thereby to provide the one or more overgrowth structures. Advantageously, overgrowth on a patterned substrate can be used to provide structures protruding from an initially substantially flat planar substrate. Such morphology can be used to enable improved light emission properties from LED devices in combination with improved strain management of the underlying crystalline material upon which the LED devices are formed.

Preferably, where the patterned template layer is patterned to provide one or more overgrowth structures, forming the one or more channels comprising the conductive material through at least the first epitaxial crystalline layer and the second epitaxial crystalline layer comprises removing material from one or more sidewalls of the one or more overgrowth structures. Advantageously, removal of material to form channels through at least the first epitaxial crystalline layer and the second epitaxial crystalline layers enables electrical connection to the crystalline template layer through the first epitaxial crystalline layer and the second epitaxial crystalline layer.

Preferably, the method comprises planarizing at least a portion of the second epitaxial crystalline layer thereby to form a third epitaxial crystalline layer that is pseudomorphic with the second epitaxial crystalline layer. Advantageously, the third epitaxial crystalline layer provides a surface for the formation of functioning devices.

Preferably, the method comprises forming material in the one or more channels, preferably wherein the material forms part of the third epitaxial crystalline layer. Preferably, the third epitaxial crystalline layer is an electrically conductive layer, preferably the third epitaxial crystalline layer is in electrical communication with the crystalline template layer and/or wherein the third epitaxial layer forms part of an active region configured to emit light in response to carrier recombination. Advantageously, devices formed on the third epitaxial crystalline layer can be contacted and in electrical connection with the underlying crystalline template later. Beneficially, where the third epitaxial layer forms part of an active region configured to emit light in response to carrier recombination, the efficiency of light generation is improved. Advantageously, where the third epitaxial layer forms part of an active region on the sidewalls of features of the patterned crystalline template layer, improved electrical connection and carrier injection into the third epitaxial crystalline layer is provided which coupled with the strain relaxed second epitaxial crystalline layer provides for improved light generation from devices formed at least in part on the second epitaxial crystalline layer.

Preferably, at least one of the crystalline template layer, the first epitaxial crystalline layer, the second epitaxial crystalline layer and the third epitaxial crystalline layer comprises a semiconductor material, preferably wherein the semiconductor material is a III-V based material, more preferably wherein the III-V material is a nitride based material. Advantageously, techniques for the provision of such materials can provide high quality crystalline material with low defect density.

Preferably, the epitaxial crystalline structure forms part of a light emitting device. Advantageously, strain relaxation is managed in combination with electrical conductivity to form high quality practical devices.

Preferably, the light emitting device forms part of an array of light emitting pixels. Advantageously, arrays of light emitting pixels can be formed on the strain relaxed layer such that the in-plane lattice parameter is suited to the material requirements hence providing higher quality devices that can be electrically connected on both sides, thereby increasing the density of pixels in the array.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the Figures, in which.

The formation of strain relaxed epitaxial crystalline layers on which functioning solid state devices can be formed is described. The structure, and the method for forming the structure, address at least some of the problems described above. FIGS. 1 to 5 describe the formation of strain relaxed layers in epitaxial crystalline structures where the strain relaxed layers have an inherent, natural lattice parameter that is different from the inherent, natural, lattice parameter of the substrate upon which the strain relaxed layer is formed. The formation of such strain relaxed layers means that subsequently formed layers with an inherent crystalline lattice parameter more closely aligned to the strain relaxed layers can be formed and will therefore be able to be formed with higher crystalline quality and reduced defects.

The method and structure described herein are based on III-V crystalline materials, in particular nitride based semiconductor materials. However, in further examples, the skilled person understands that the techniques described here can be applied to different crystalline structures and semiconductor materials, such as other III-V crystalline materials, or II-VI crystalline materials. Advantageously, not only does the structure provide a template layer for forming materials with natural lattice parameters more closely aligned to the template than the underlying bulk substrate layers, but it also allows for the materials with natural lattice parameters more closely aligned to the template to be formed on an electrically conductive template, therefore enabling practical functioning devices of high crystalline quality to be formed, for example high resolution arrays of light emitting diode (LED) devices.

Figure 1A:
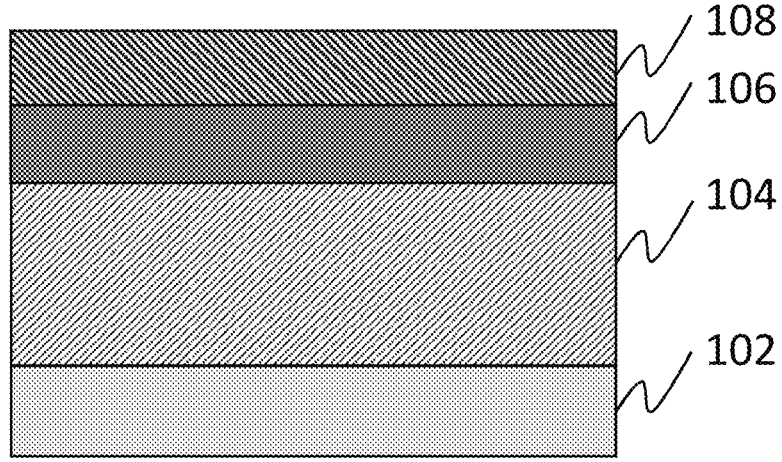
FIG. 1A shows a cross sectional view of an epitaxial crystalline structure.

FIG. 1A shows a cross sectional view of an epitaxial structure 100A. The epitaxial structure 100A provides an initial template for forming devices and is formed by metal organic chemical vapour deposition (MOCVD). In further examples, alternative and/or additional growth and/or deposition techniques are used to provide the epitaxial layers described herein. In an example, molecular beam epitaxy (MBE) is used. Light emitting diode (LED) devices are typically formed by providing a growth substrate, upon which multiple epitaxial layers of semiconductor crystalline material are grown and/or deposited to form functioning devices. For gallium nitride (GaN) based LED devices, n-type doped n-GaN is typically provided as a base layer for the formation of p-n junctions. The epitaxial structure 100A provides a structure that is processed in order to enable the formation of devices, such as LED devices with high quality crystalline material, whilst enabling the devices to be formed on an electrical conductive layer.

In FIG. 1A, there is shown a growth substrate 102. The growth substrate 102 is formed from silicon. In further examples, alternative and/or additional materials are used to form the substrate, such as sapphire, silicon carbide, or any other suitable substrate material. Upon the growth substrate 102, n-type doped n-GaN is provided and effectively acts as a crystalline template layer 104. Whilst the crystalline template layer 104 is shown as a n-type GaN layer, in further examples, alternative and/or additional layers, such as buffer layers, are included in order to control the properties of the n-GaN layer (such as crystalline quality, doping level, thickness etc.). The crystalline template layer 104 is approximately 1000 nm thick and is doped at a concentration of $5 \times 10^{18}$ at/cm$^3$. In further examples, the crystalline template layer 104 is formed to a different thickness and has a different doping concentration whilst still enabling the functionality described herein. In further examples, the crystalline template layer 104 is a p-type doped layer formed in order to provide the functionality described herein and the composition of the subsequently formed layers is adjusted accordingly.

On top of the n-type crystalline template layer 104 there is formed a first epitaxial crystalline layer 106, the first epitaxial crystalline layer 106 is formed from gallium nitride (GaN). Accordingly, the first epitaxial crystalline layer 106 has the same natural, relaxed, in-plane lattice constant as the crystalline template layer 104. In further examples, the first epitaxial crystalline layer 106 is formed from a different material and is pseudomorphic with the crystalline template layer 104. The first epitaxial crystalline layer 106 is formed as a highly doped layer, where the doping is such that there is an initial doping contrast between the highly doped first epitaxial crystalline layer 106 and the n-type crystalline template layer 104. Such contrast allows for the porosification of the first epitaxial crystalline layer 106 in a subsequent step, describe below with respect to FIG. 1B. The first epitaxial crystalline layer has a thickness of approximately 30 nm and is initially doped at a concentration of the order of $1 \times 10^{20}$ at/cm$^3$. Such a doping concentration is achieved using Si. In further examples, co-doping using Si and Al is used to achieve such a doping concentration, while preventing excessive surface roughening. In further examples, different techniques, concentrations and thicknesses are alternatively and/or additionally used to form the first epitaxial crystalline layer 106. Advantageously, the use of a thin first epitaxial crystalline layer 106 of the order of 30 nm provides a highly defective layer after the porosification treatment, where broken bonds allow for movement of misfit dislocations. In further examples, the first epitaxial crystalline layer 106 has a thickness of between 1 nm and 300 nm, preferably between 20 nm and 50 nm. In further examples, the first epitaxial crystalline layer 106 is initially doped with Si at a concentration of between $8 \times 10^{18}$ at/cm$^3$ and $5 \times 10^{20}$ at/cm$^3$ and preferably between $3 \times 10^{19}$ at/cm$^3$ and $1 \times 10^{20}$ at/cm$^3$. In further examples, the first epitaxial crystalline layer 106 is co-doped with Al and Si with a mole fraction between 0.5% to 10%, and preferably between 1% and 3%.

Upon the first epitaxial crystalline layer 106 there is provided a second epitaxial crystalline layer that is an undoped layer 108, the undoped second epitaxial crystalline layer 108 is a layer with an inherently different lattice constant to the crystalline template layer 104 and the first epitaxial crystalline layer 106. In the example of FIG. 1A, the second epitaxial crystalline layer 108 is an undoped layer of indium gallium nitride (InGaN). The undoped second epitaxial crystalline layer 108 is approximately 100 nm to 150 nm thick. Advantageously, the second epitaxial crystalline layer 108 has a thickness that enables elastic relaxation. Accordingly, the growth of the second epitaxial crystalline layer 108 results in a second epitaxial crystalline layer 108 that is initially strained by the underlying material of the crystalline template layer 104 and the first epitaxial crystalline layer 106 such that the different inherent, natural, in-plane lattice parameter of the second epitaxial crystalline layer 108 is pseudomorphically aligned with the inherent, natural, in-plane lattice parameter of the first epitaxial crystalline layer 106. In further examples, the second epitaxial crystalline layer 108 is formed with a different thickness, whilst enabling the functionality described herein. In an example, the second epitaxial crystalline layer 108 has a thickness between 100 nm and 500 nm. In further examples, the second epitaxial crystalline layer 108 has a thickness preferably between 150 nm and 200 nm. The second epitaxial crystalline layer 108 is a bulk layer of InGaN with In composition of between 0% and 25% and preferably between 6% and 15%. Whilst the second epitaxial crystalline layer 108 is a bulk InGaN layer, in further examples, the second epitaxial crystalline layer 108 is a superlattice structure of multiple layers with alternating chemical composition that provides an average indium composition in InGaN of between 0% and 25% and preferably between 6% and 15%. In an example, when the InGaN second epitaxial crystalline layer is a superlattice structure, the inherent different lattice constant to the crystalline template layer 104 is related to the average composition over the whole superlattice layer forming the second epitaxial crystalline layer.

The provision of such an epitaxial structure 100A with a high doping contrast between the first epitaxial crystalline layer 106, the crystalline template layer 104 and the second epitaxial crystalline layer 108 enables porosification of the initially highly doped first epitaxial crystalline layer 106. The porosification of the first epitaxial crystalline layer 106 occurs by an electrochemical process. Electrochemical etching processes can be used selectively to etch epitaxial layers such that the most conductive layer is etched first. The porosification of buried layers in an epitaxial structure, such as the epitaxial structure 100A of FIG. 1A can take place through threading dislocation cores in the second epitaxial crystalline layer 108. Advantageously, the topmost second epitaxial crystalline layer 108 need not be attacked and there is no need to pattern the second epitaxial crystalline layer 108 in order to porosify subsurface layers. Whilst the second epitaxial crystalline layer 108 is described as an undoped layer 108, in further examples, the undoped second epitaxial crystalline layer 108 has a level of doping that provides sufficient contrast in conductivity to enable the porosification of a subsurface layer in accordance with the methods described herein.

Electrochemical etching of the epitaxial structure 100A results in porosification of the first epitaxial crystalline layer 106 through threading dislocations or other openings in the undoped InGaN of the second epitaxial crystalline layer 108 enabling such electrochemical processing of the subsurface first epitaxial crystalline layer 106 to take place. This is facilitated by the high doping contrast between the n-type crystalline template layer 104 and first epitaxial crystalline layer 106 meaning that only the first epitaxial crystalline layer 106 becomes porosified during an electrochemical etching of this layer. Advantageously, the doping contrast enables control of the porosification process since, as the first epitaxial crystalline layer 106 has pores formed in it, the porosified first epitaxial crystalline layer 106' becomes highly resistive and therefore the electrochemical process used to porosify the first epitaxial crystalline layer 106 stops forming pores.

Accordingly, once the epitaxial structure 100A has been processed by electrochemical etching in order to provide a porous first epitaxial crystalline layer 106', the first epitaxial crystalline layer 106 becomes a porous and compliant epitaxial crystalline layer 106'.

Figure 1B:
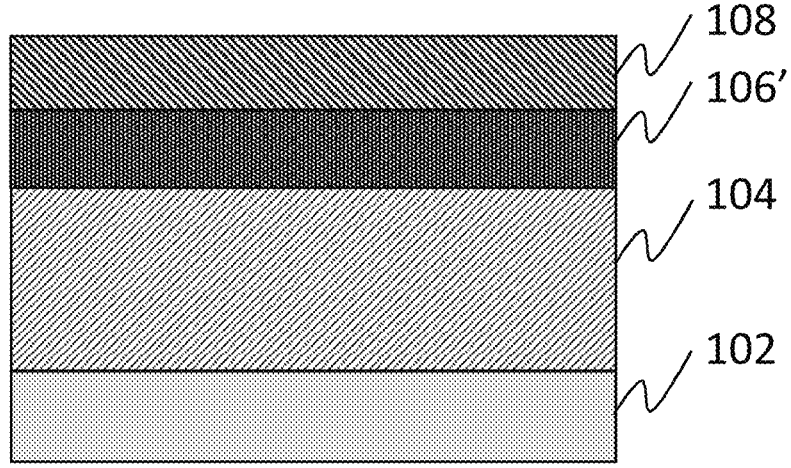
FIG. 1B shows a cross sectional view of the epitaxial crystalline structure of FIG. 1A that has been processed further.

FIG. 1B shows a processed version of epitaxial structure 100A. Epitaxial structure 100B is a processed version of the epitaxial structure 100A whereby the first epitaxial crystalline layer 106 has been porosified in order to provide pores throughout the porous first epitaxial crystalline layer 106'. Such porosification enables strain relaxation of the second epitaxial crystalline layer 108 of undoped InGaN. Such strain relaxation requires the second epitaxial crystalline layer 108 to expand. The lateral expansion of the second epitaxial crystalline layer 108 is controlled in order to provide advantageous structures, as described below. The extent to which the porosified first epitaxial crystalline layer 106' is, by density of volume, pore and GaN material, depends on the electrochemical etching process. The electrochemical etching process, whilst beneficially providing compliant material in a subsurface layer, results in the porosified first epitaxial crystalline layer 106' having a reduced electrical conductivity compared with the highly doped conductivity of the first epitaxial crystalline layer 106 when initially formed.

As described above, the second epitaxial crystalline layer 108, which is initially strained to the first epitaxial crystalline layer 106, should expand in order to relax. The expansion of the second epitaxial crystalline layer 108 is controlled by the formation of appropriate gaps and/or channels, as described with reference to FIGS. 2 to 5.

Figure 2A:
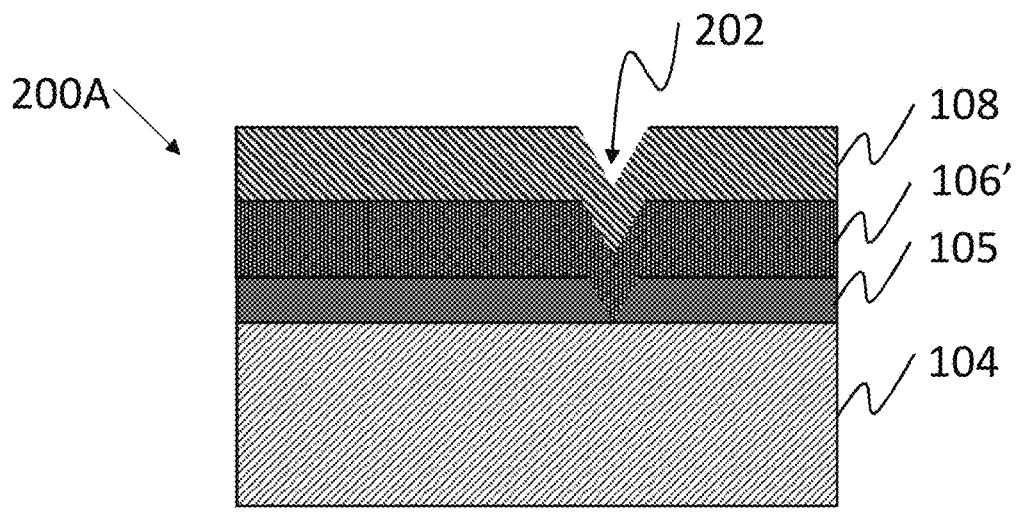
FIG. 2A shows a cross sectional view of an epitaxial crystalline structure comprising V-pits.

At FIG. 2A there is shown a cross sectional view of an epitaxial structure 200A that is provided in accordance with processed epitaxial structure 100B described with respect to FIG. 1B, such that there is a crystalline template layer 104, a porosified first epitaxial crystalline layer 106' and second epitaxial crystalline layer 108. The epitaxial structure 200A further shows a V-pit 202 in the surface of the second epitaxial crystalline layer 108. Such V-pit 202 is created in the formation of the n-type crystalline template layer 104. FIG. 2A shows a top layer 105 of the crystalline template layer 104. The top layer 105 is also formed from GaN, however, the formation of V-pits in the top layer 105 is enabled by changing the growth conditions when forming the crystalline template layer 104. For example, V-pits in the top layer 105 of the crystalline template layer 104 can be initiated by lowering the growth temperature. Such a top layer 105 is of the order of 50 nm thick. Advantageously, such a thickness generates V-pits in subsequent layers of an appropriate thickness to enable channels to be formed through the epitaxial structure 200A. In further examples, the top layer 105 has a configuration designed to provide the functionality described herein. The cross sectional view of the epitaxial structure 200A shows one V-pit, however, in further examples, additional V-pits are formed across the planar surface of the top layer 105 of the crystalline template layer. In an example, such V-pits are formed randomly across the top layer 105 of the crystalline template layer.

The formation of V-pits in the top layer 105 of the crystalline template layer 104 results in V-pits that propagate through subsequently grown layers. Accordingly, V-pit 202 is formed in the surface of the second epitaxial crystalline layer 108 in accordance with the V-pit formed in the top layer 105 of the crystalline template layer 104. In further examples, additional and/or alternative techniques are used to form V-pits 202 in the second epitaxial crystalline layer 108.

Once one or more V-pits 202 are formed in the second epitaxial crystalline layer 108, the epitaxial structure 200A is processed in order to enlarge the V-pits 202, thereby to open one or more channels and expose at least part of the crystalline template layer 104 and/or the top layer 105 of the crystalline template layer 104. This is shown at FIG. 2B, where the sidewalls of the V-pits 202 are shown to have been etched.

Figure 2B:
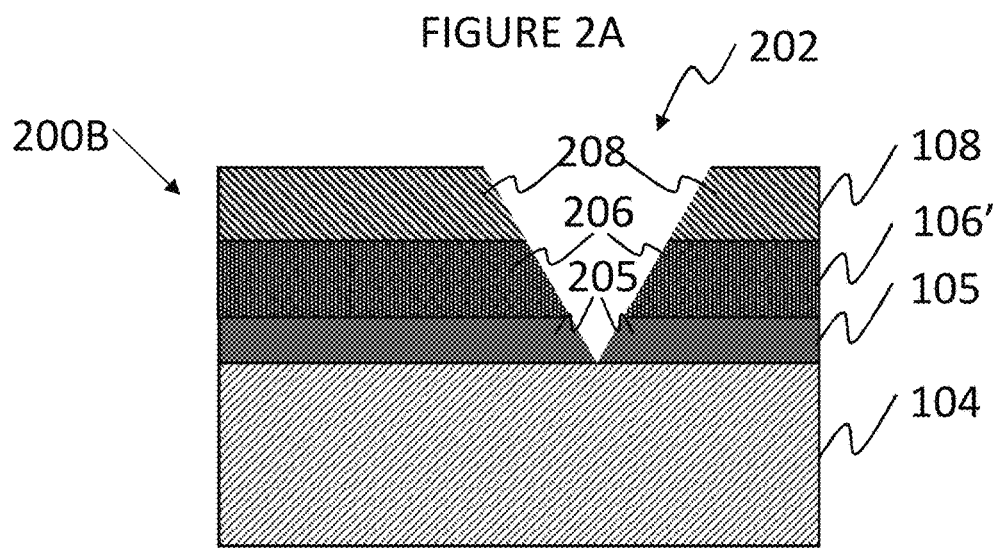
FIG. 2B shows a cross sectional view of the epitaxial crystalline structure of FIG. 2A that has been processed further.

FIG. 2B shows a cross sectional view of an epitaxial structure 200B, which is the epitaxial structure 200A of FIG. 2A that is been processed further. There is shown at FIG. 2B the enlargement of the V-pit 202 by etching of the sidewalls of the V-pit 202. Processing of the epitaxial structure 200A of FIG. 2A by wet etching enables anisotropic etching of the epitaxial structure 200A. Wet etching is performed using potassium hydroxide (KOH) at an elevated temperature. In further examples, additional and/or alternative techniques are used in order to etch and enlarge the V-pits 202. For example, tetramethylammonium hydroxide (TMAh) is used.

As shown at FIG. 2B, the sidewalls 208 of the second epitaxial crystalline layer 108 of undoped InGaN are etched to provide an open path to the conductive GaN. Subsequently the sidewalls of 206 of the porosified first epitaxial crystalline layer 106 and the sidewalls 205 of the V-pitted top layer 105 are enlarged. The resultant etched V-pit 202 is substantially the depth of the thickness of the porosified first epitaxial crystalline layer 106' combined with the thickness of the second epitaxial crystalline layer 108 of undoped InGaN. Advantageously, such enlargement provides a route for electrical connection to the n-type crystalline template layer 104 through the epitaxial structure 200B. Once the sidewalls 205, 206, 208 of the V-pit 202 have been etched to provide one or more channels through at least the porosified first epitaxial crystalline layer 106' and the second epitaxial crystalline layer 108, the epitaxial structure 200B is processed further, as shown at FIG. 2C.

Figure 2C:
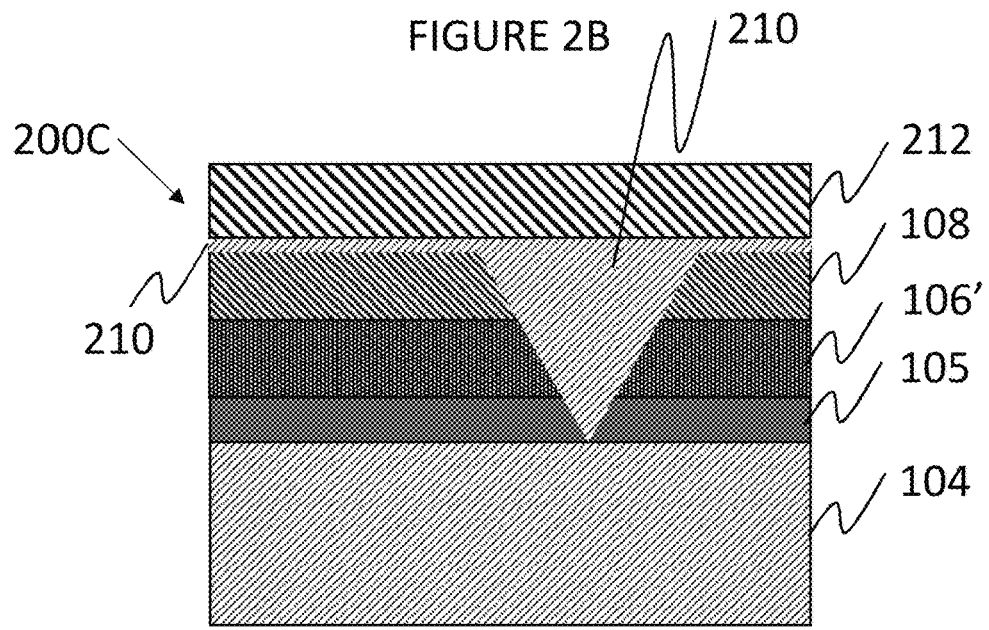
FIG. 2C shows a cross sectional view of the structure of FIG. 2B that has been processed further.

FIG. 2C shows a cross sectional view of an epitaxial structure 200C, which is the epitaxial structure 200B of FIG. 2B that has been processed further. At FIG. 2C there is shown a conductive material that is an n-type material 210 formed in the channel provided by the enlarged V-pit 202 described with reference to FIGS. 2A and 2D. The n-type material 210 also forms a third epitaxial crystalline layer that is a thin pseudomorphic layer of n-type material 210 on top of the second epitaxial crystalline layer 108 of undoped InGaN. The n-type material 210 is in electrical contact with the n-type material of the crystalline template layer 104, beneficially enabling current spreading and the facility to make contact via the n-doped side of the epitaxial structure 200C in subsequently formed devices. The n-type material 210 planarizes the structure. When formed of GaN, the planarized layer of n-type material 210 is under tensile stress when the second epitaxial crystalline layer 108 of undoped InGaN is relaxed. Whilst the conductive n-type material 210 is formed of GaN, in further examples, the conductive material 210 is formed from a different material. In an example, the conductive n-type material 210 is formed from InGaN with an In composition of between 0% and 6%. The conductive material 210 is formed as a layer with a thickness of between 5 nm and 300 nm and preferably between 20 nm and 100 nm.

Whilst the conductive material formed in the one or more channels provided by the V-pits 202 is an n-type material 210 that is shown to planarize the structure, in further examples, alternatively or additionally, the conductive n-type material 210 partially planarizes the second epitaxial crystalline layer 108 or does not planarize the second epitaxial crystalline layer 108, whilst still at least partially filling the one or more channels provided by V-pits 202 with conductive material thereby to provide conductivity to relatively strain relaxed regions formed subsequently to the relaxation of the second epitaxial crystalline layer 108.

On top of the n-type material 210 there is formed a further layer 212. The further layer 212 is, in an example, an epitaxial structure of multiple layers with an active region associated with the provision of red light from InGaN based quantum wells (QWs). Advantageously, the further layer 212 benefits from being formed on an electrically conductive layer that is pseudomorphic with the second epitaxial crystalline layer 108. Whilst the further layer 212 is shown to be provided on the n-type material 210, in further examples the further layer 212 is provided on both the n-type material 210 and the second epitaxial crystalline layer 108. In further examples, the further layer 212 comprises one or more LED devices, which, in a further example, form an array of devices, such as a high resolution array of microLED devices. In further examples, the further layer 212 alternatively and/or additionally forms part of the n-type material 210 and/or replaces the n-type material, thereby beneficially to enable carrier injection directly into the portion of the strain relaxed material formed on the second epitaxial crystalline layer 108 through the further layer 212 formed at least partially on a sidewall of the n-type crystalline template layer 104, such as the V-pitted top layer 105 of the crystalline template layer 104.

Whilst the enlarged V-pit 202 of the structures 200 is described with respect to FIG. 2A to 2C to provide routes to enable conductive material to be formed on the second epitaxial crystalline layer 108, and facilitate strain relaxation of the second epitaxial crystalline layer 108, the location and density of V-pits 202 in top layer 105 of the crystalline template layer 104 are, to an extent, random. The density of V-pits 202 in the top layer 105 is controlled using appropriate growth techniques to enable electrical connection in a controlled manner.

FIGS. 3A to 3D show further structures that are incorporated into the epitaxial structure 200A to C of FIGS. 2A to 2C to provide further control of the resultant template structure.

Figure 3A:
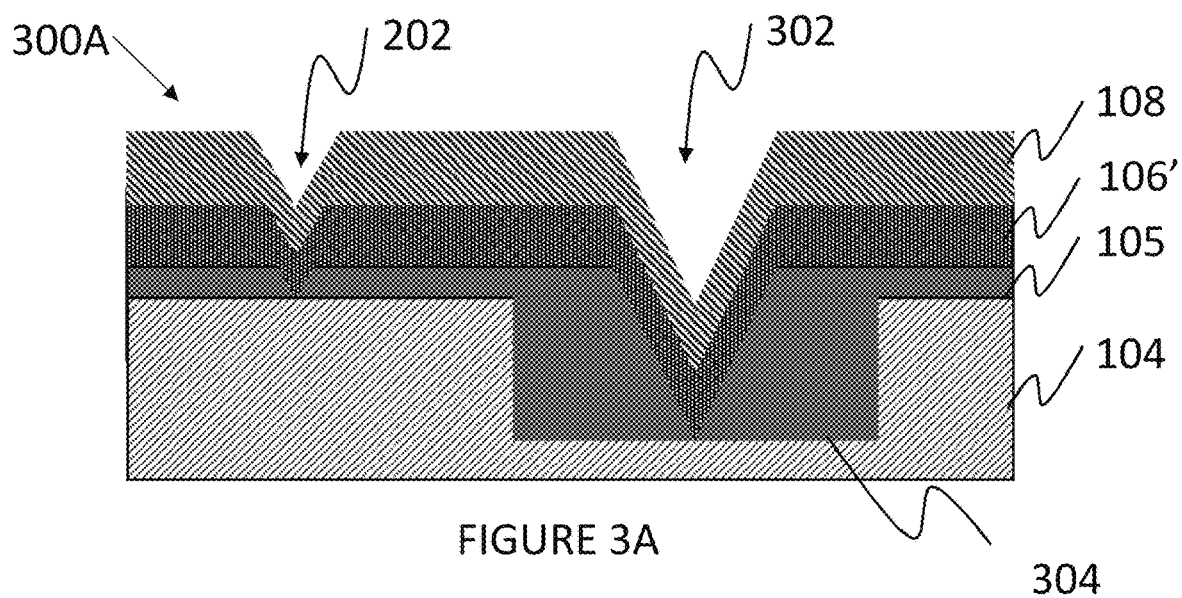
FIG. 3A shows a cross sectional view of an epitaxial structure comprising V-pits and V-grooves.

FIG. 3A shows a cross sectional view of an epitaxial structure 300A. The epitaxial structure 300A is the structure 200A of FIG. 2A that has been processed using an additional step.

FIG. 3A shows a trench 304 formed in the crystalline template layer 104. The trench 304 is formed using a lithographic technique that uses patterning and etching steps to form the trench 304. In further examples, the crystalline template layer 104 is processed using different techniques to provide the trench 304. The trench 304 is formed in accordance with any beneficial structure in the crystalline template layer 104 that is to be subsequently processed.

Once a trench 304 is formed in the crystalline template layer 104, the subsequent layers 105, 106, 108 are epitaxially formed. Such formation results in a V-groove 302 in the epitaxial structure 300A that corresponds to the trench 304. V-pits are additionally formed in the top layer 105 of the crystalline template layer 104 and propagate through the layers to provide the V-pit 202 in addition to the V-groove 302. In further examples, V-grooves 302 are provided without V-pits 202.

Whilst the trench 304 is shown to be formed in the crystalline template layer 104 prior to forming the subsequent epitaxial layers, thereby to enable the formation of channels through at least the porosified first epitaxial crystalline layer 106' and the second epitaxial crystalline layer 108, in further examples the trench 304 is formed by patterning the crystalline template layer 104 with a mask and forming overgrowth material on the mask-patterned crystalline template layer 104. Such a technique is used to provide an array of columns each having a regular trapezoidal cross section normal to the substrate, for example as described in WO 2020/008200 A1. Overgrowth on such a mask-patterned crystalline template layer 104 is used in further examples to provide underlying layers for the formation of an array of light emitting devices, as described in further detail with respect to FIGS. 5A and 5B. In further examples, the morphology of the crystalline template layer 104 is controlled by patterning and/or other techniques to provide appropriate underlying substrate for improved device formation.

Once V-grooves 302 have been formed, the process moves on analogously to that shown with respect to FIG. 2. At FIG. 3B there is shown a cross sectional view of an epitaxial structure 300B that is the epitaxial structure 300A of FIG. 3A that has been processed further.

Figure 3B:
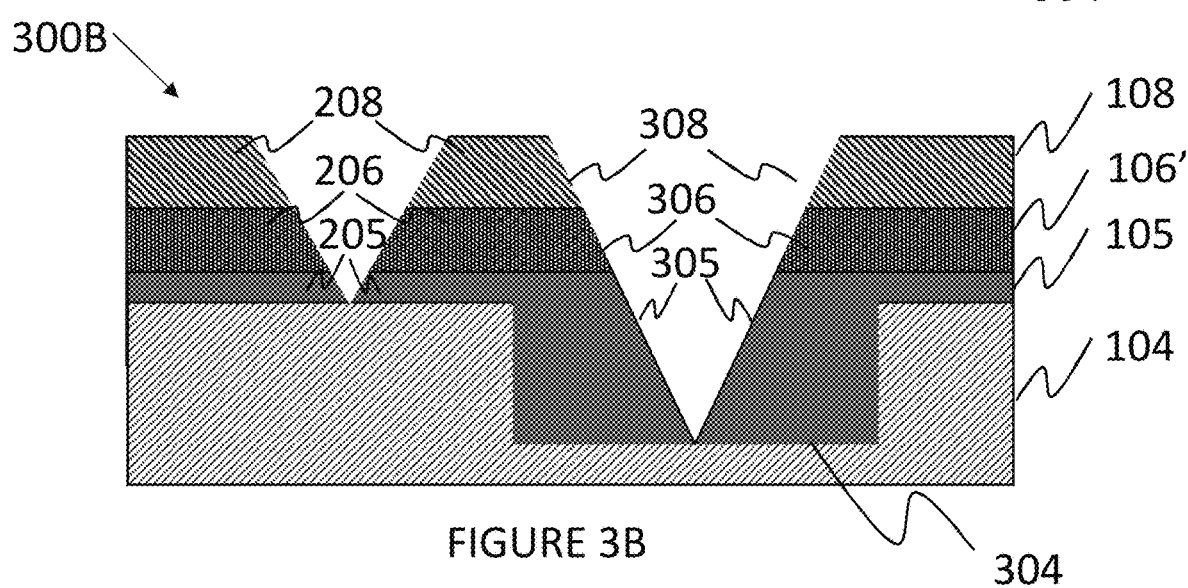
FIG. 3B shows a cross sectional view of the structure of FIG. 3A that has been processed further.

There is shown at FIG. 3B the enlargement of the V-pit 202 by etching of the sidewalls and the enlargement of the V-groove 302 by etching of the sidewalls. Processing of the epitaxial structure 300A of FIG. 3A by wet etching enables anisotropic etching of the epitaxial structure 300A. As shown at FIG. 3B, the sidewalls 308 of the second epitaxial crystalline layer 108 are etched. Subsequently the sidewalls of 306 of the porosified first epitaxial crystalline layer 106' and the sidewalls 305 of the V-pitted top layer 105 are enlarged. Advantageously, such enlargement provides room for the second epitaxial crystalline layer 108 of undoped InGaN to expand and thus strain relax, as well as providing a route for electrical connection to the n-type crystalline template layer 104 through the epitaxial structure 300B. Advantageously, forming V-grooves 302 in this manner provides a method for tuning the width of the gap in which material is subsequently formed. This is beneficial where, for example, lithographic techniques for forming V-grooves in an already formed epitaxial structure, in order to provide conduction paths to the n-type material, are not practical for forming V-grooves on a sufficiently small scale.

Figure 3C:
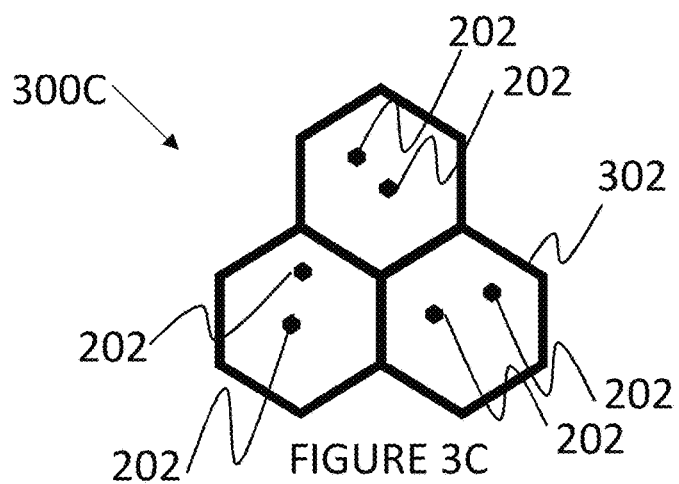
FIG. 3C shows a plan view of the structure of FIG. 3B.
Figure 3D:
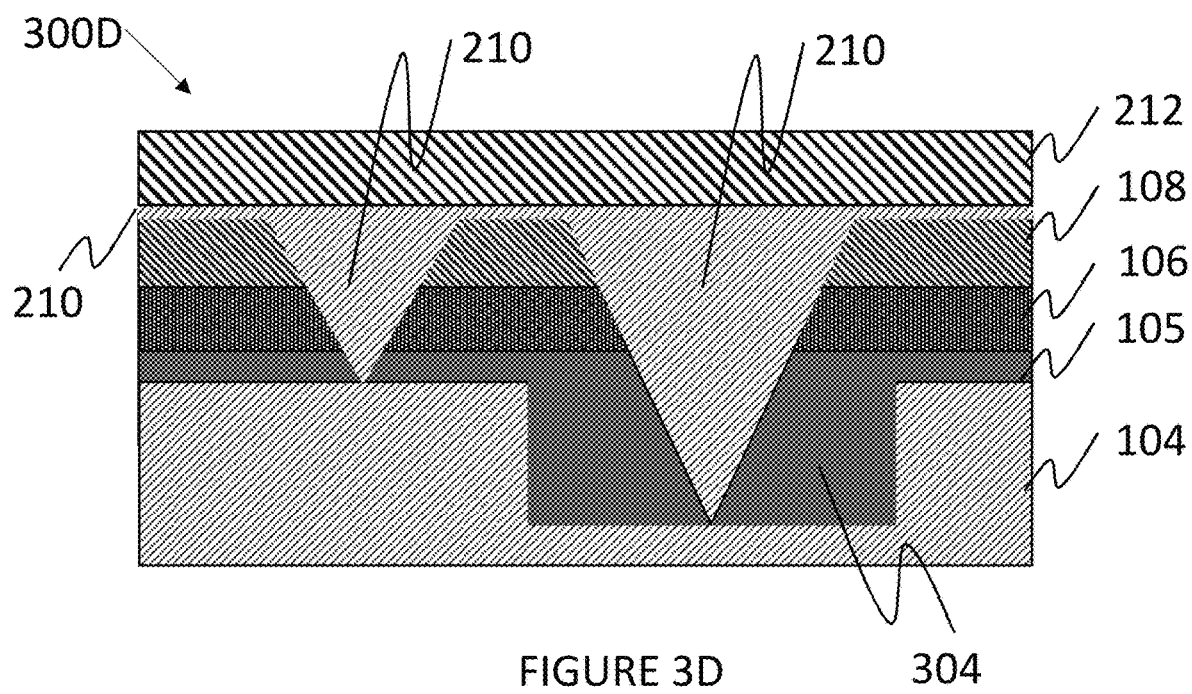
FIG. 3D shows a cross sectional view of the structure of FIG. 3B that has been processed further.

Strain relaxation is facilitated by annealing the structure 300 B of FIG. 3B. In further examples, strain relaxation is facilitated using additional and/or alternative techniques. Once the sidewalls 305, 306, 308 of the V-groove 302 have been etched, the epitaxial structure 300B is processed further, as shown at FIG. 3D. FIG. 3C shows a plan view 300C of the structure of FIG. 3B. There is shown randomly distributed V-pits 202 in the surface of the second epitaxial crystalline layer 108. There is also shown a V-groove 302 forming a hexagonal pattern. Accordingly, the V-groove 302 isolates portions of the second epitaxial crystalline layer 108 of InGaN in order to form islands or domains by valleys at least partially forming the perimeter of one or more islands in the second epitaxial crystalline layer 108, such that the valleys at least partially surround one or more islands in the second epitaxial crystalline layer 108. Whilst the V-groove 302 is shown in a hexagonal configuration, in further examples, the V-groove 302 is alternatively and/or additionally formed in any appropriate configuration. Advantageously, the formation of two dimensional islands in the second epitaxial crystalline layer 108 based on such lithographic patterning and etching of the crystalline template layer 104 provides strain relaxed islands with lateral dimensions of the order of 1 µm to 10 µm. Such formation of islands is highly controllable and provides relaxed island domains comparable with the size of devices that are formable on the relaxed islands domains, such as micro LED devices with a pixel size of the order of 1 µm to 10 µm. In further examples, the lateral dimensions of the islands are controlled to provide strain relaxed islands of dimensions appropriate to the formation of device based on subsequently formed crystalline layers.

Once the epitaxial structure 300B of FIG. 3B has been provided, the epitaxial structure 300B is then planarized. This is shown at FIG. 3D. FIG. 3D shows that is the structure 300D that is the epitaxial structure 300B of FIG. 3B that has been processed further. There is shown n-type material 210 formed in the channels provided by the V-grooves 302 and the V-pits 202. The random V-pits 202 filled with the n-type material 210 provide uniform electron injection into subsequent layers. As with the epitaxial structure 200C of FIG. 2C, a subsequent pseudomorphic layer 212 is formed upon the planarized layer of n-type material 210. The planarized layer of n-type material 210 is under tensile stress when formed from n-GaN, as the second epitaxial crystalline layer 108 beneath it is relaxed. Whilst the conductive material formed in the one or more channels provided by the V-grooves 302 and/or etched V-grooves 302 is a conductive n-type material 210 that is shown to planarize the structure, in further examples, alternatively or additionally, the conductive n-type material 210 partially planarizes the second epitaxial crystalline layer 108 or does not planarize the second epitaxial crystalline layer 108, whilst still at least partially filling the one or more channels provided by V-pits 202 and/or V-grooves 302 with conductive material thereby to provide conductivity to relatively strain relaxed regions formed subsequently to the relaxation of the second epitaxial crystalline layer 108.

Whilst the further layer 212 is shown to be provided on the n-type material 210, in further examples the further layer 212 is provided on both the n-type material 210 and the second epitaxial crystalline layer 108. In further examples, the further layer 212 comprises one or more LED devices, which, in a further example, form an array of devices, such as a high resolution array of micro LED devices. In further examples, the further layer 212 alternatively and/or additionally forms part of the n-type material 210 and/or replaces the n-type material, thereby beneficially to enable carrier injection directly into the portion of the strain relaxed material formed on the second epitaxial crystalline layer 108 through the further layer 212 formed at least partially on a sidewall of the n-type crystalline template layer 104, such as the sidewall of the enlarged V-grooves 302.

Whilst photolithography and etching techniques are used to form the trenches 304 in the crystalline template layer 104, in further examples different patterning techniques are used. Further, whilst the relative cross sectional size of the V-pits 202 and the V-grooves 302 are shown in FIGS. 3A to 3D such that the V-grooves 302 are significantly deeper than the V-pits 202, in further examples, the V-grooves 302 and V-pits 202 have different relative sizes. The V-pits 202 and the V-grooves 302 advantageously effectively provide channels for the electrical connection of the crystalline template layer 104 with layers formed on the insulating second epitaxial crystalline layer 108. Beneficially, V-pits 202 aid uniform electron injection into subsequently grown layers.

Advantageously, V-grooves 302 aid relaxation of the second epitaxial crystalline layer 108 and V-pits 202 provide channels for electrical connection with the crystalline template layer 104. If the subsequently formed devices, such as LED devices providing pixels with defined light emitting surfaces have a light emitting surface area greater than the V-groove 302 density, the structure can be provided without V-pits 202, as sufficient current spreading may be enabled through the V-grooves 302. If the light surface area of a pixel, for example, is less than the density of V-grooves 302, V-pits 202 are particularly beneficial in providing sufficient current spreading in the LED device associated with the pixel.

Figure 4A:
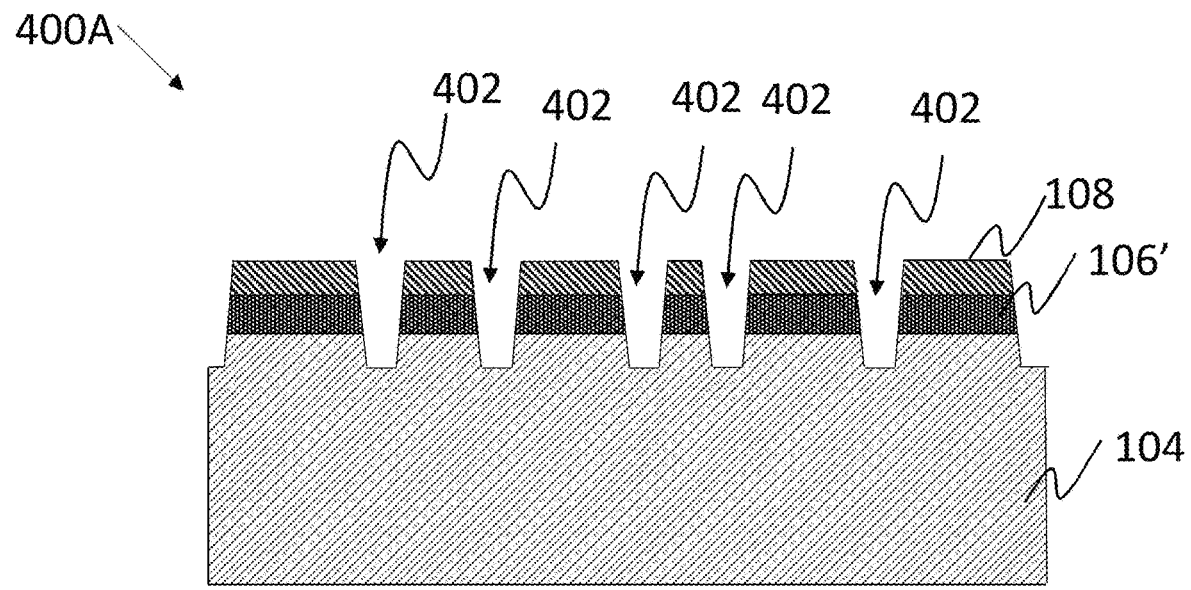
FIG. 4A shows a cross sectional view of the structure of FIG. 1B that has been processed further.

FIG. 4A shows a cross section view of an epitaxial structure 400A that is a processed version of the epitaxial structure 100B of FIG. 1B. In order to enable lateral relaxation of the second epitaxial crystalline layer 108 following porosification of the first epitaxial crystalline layer 106 to provide the porosified first epitaxial crystalline layer 106', channels are formed through the epitaxial structure 400A.

The epitaxial structure 400A is patterned on the surface of the second epitaxial crystalline layer 108 using a self-assembled hard mask. A thin film of nickel (Ni) is evaporated on the surface of the second epitaxial crystalline layer 108. The thin film of nickel is subsequently annealed to form random droplets. A dry etch is then used to form channels 402 through the epitaxial structure 400A in order to provide channels to the conductive n-type crystalline template layer 104. The nickel mask is then removed using a wet clean technique. Whilst porosification of the first epitaxial crystalline layer 106 occurs prior to the channels 402 being formed, in further examples, alternatively or additionally, channels 402 are formed before the porosification of the first epitaxial crystalline layer 106. Advantageously, the channels 402 formed through the first epitaxial crystalline layer 106 (or porosified first epitaxial crystalline layer 106') and the second epitaxial crystalline layer 108 at least partially define the perimeter of two dimensional domains or islands in the second epitaxial crystalline layer 108.

Figure 4B:
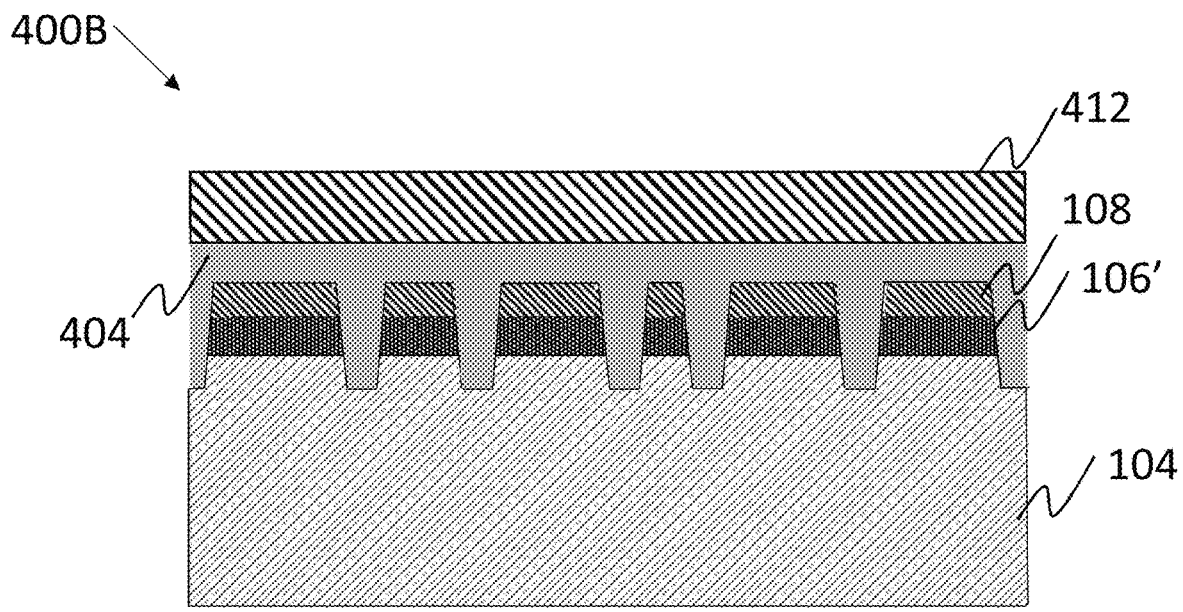
FIG. 4B shows a cross sectional view of the structure of FIG. 4A that has been processed further.

Once the channels 402 have been formed, the process moves to FIG. 4B. At FIG. 4B there is shown a cross sectional view of an epitaxial structure 400B that is the epitaxial structure 400A of FIG. 4A that has been processed further in order to form a planarized layer 404 of material in the channels 402. Whilst the conductive material 404 formed in the one or more channels is an n-type material 404, such as n-type GaN, that is shown to planarize the structure, in further examples, alternatively or additionally, the conductive n-type material 404 partially planarizes the second epitaxial crystalline layer 108 or does not planarize the second epitaxial crystalline layer 108, whilst still at least partially filling the one or more channels provided by channels 402 with conductive material 404 thereby to provide conductivity to relatively strain relaxed regions formed subsequently to the relaxation of the second epitaxial crystalline layer 108.

A further layer 412, which is an example InGaN red light emitting active region is then formed on the material 404 in an analogous fashion to the further layer 212 described with reference to FIGS. 2 and 3. Such a further layer 412, in further example, forms one or more LED structures. In further examples, such LED structures form part of an array of LED devices, such as a high resolution array of micro LED devices. Whilst the further layer 412 is shown to be provided on the n-type material 404, in further examples the further layer 412 is provided on both the n-type material 404 and the second epitaxial crystalline layer 108. In further examples, the further layer 412 comprises one or more LED devices, which, in a further example, form an array of devices, such as a high resolution array of micro LED devices. In further examples, the further layer 412 alternatively and/or additionally forms part of the n-type material 404 and/or replaces the n-type material, thereby beneficially to enable carrier injection directly into the portion of the strain relaxed material formed on the second epitaxial crystalline layer 108 through the further layer 412 formed at least partially on a sidewall of the n-type crystalline template layer 104, such as a sidewall of the channel 402 formed through to the crystalline template layer 104.

Advantageously, self-assembled nickel droplets are small and dense, very narrow gaps can be created such that strain relaxation is easier, as well as planarization. Planarization can be achieved over a short distance for narrow gaps. Further filing such a dense distribution of gaps with the n-type material 210 provides good current flow through the epitaxial structure 400B.

Beneficially, the use of a hard mask, such as a self-assembled nickel hard mask described with respect to FIGS. 4A and 4B enables the formation of densely packed two dimensional islands in the second epitaxial crystalline layer 108 with lateral dimensions of the order of between 250 nm and 1000 nm. Advantageously, islands formed on such a scale not only facilitate planarization, but they also provide for a uniform strain relaxed layer where the lateral dimensions of the islands are less than the lateral dimensions of the devices formed in layer upon the relaxed islands, such as micro LED devices where the pixel size is typically greater than 1000 nm. This means that, effectively, a size-agnostic strain relaxation layer can be provided where the scale of the relaxed islands is less than the scale of the functioning devices formed on the relaxed islands.

Figure 5A:
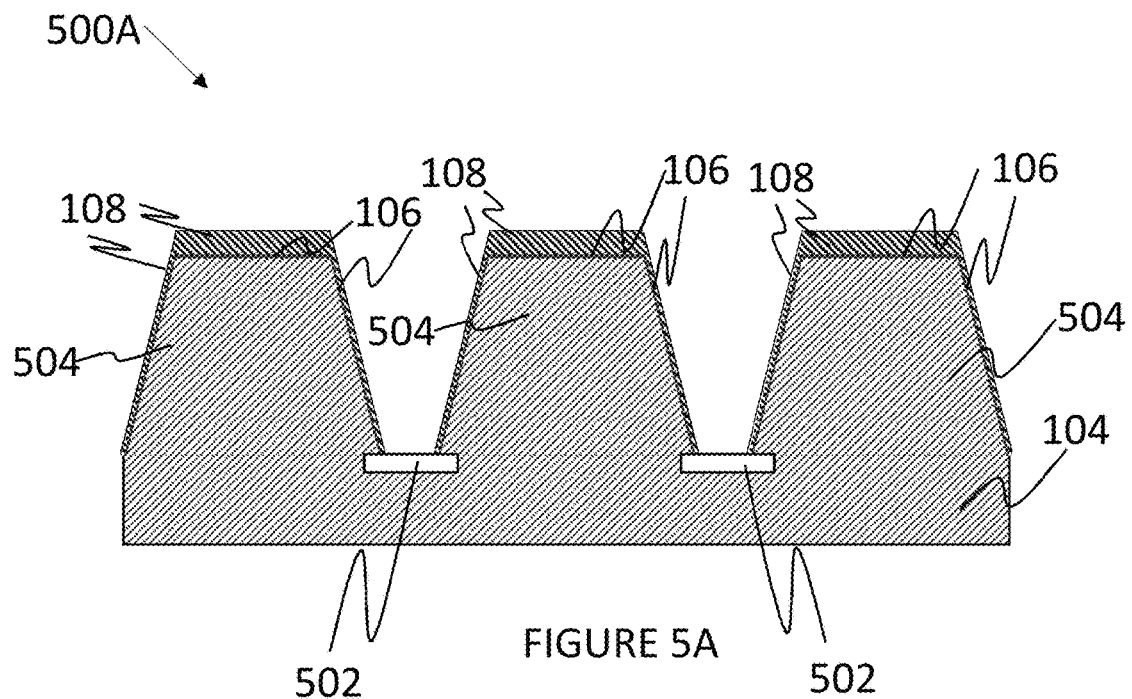
FIG. 5A shows a cross sectional view of an epitaxial structure formed on a template.
Figure 5B:
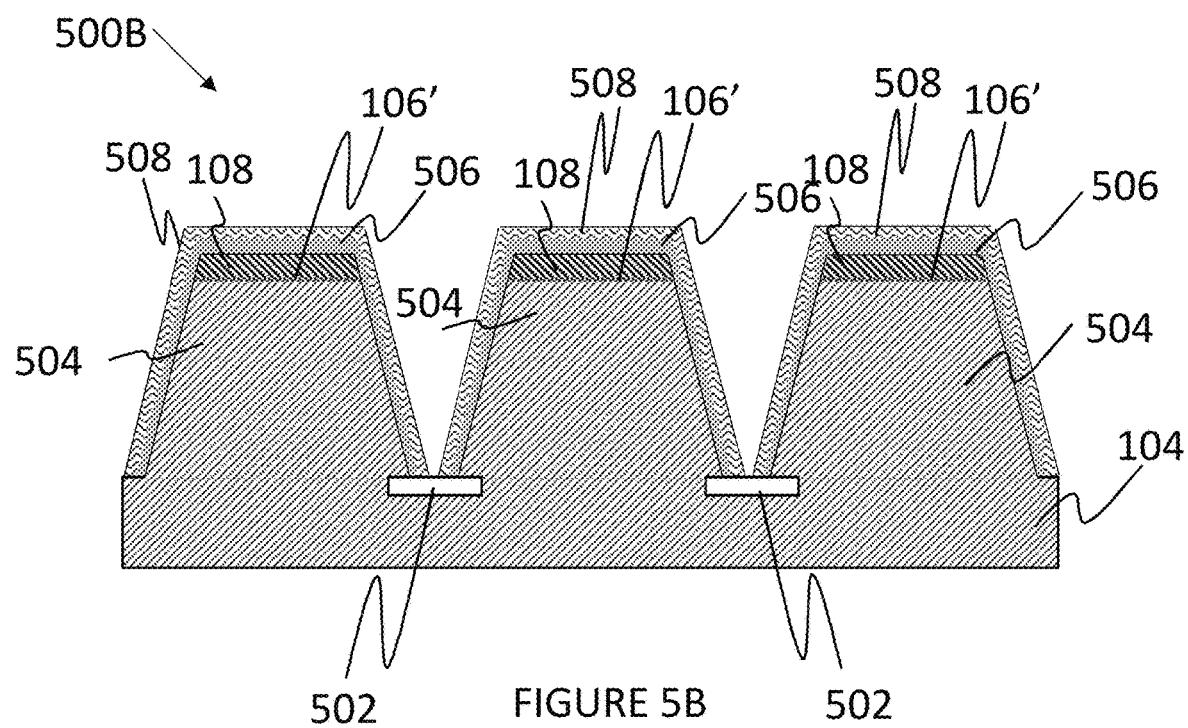
FIG. 5B shows a cross sectional view of the structure of FIG. 5A that has been processed further.

At FIGS. 5A and 5B there is shown the formation of the porosified first epitaxial crystalline layer 106' and the second epitaxial crystalline layer 108 on a crystalline template layer 104 with a morphology provided by patterning the crystalline template layer 104.

FIG. 5A shows a cross sectional view of an epitaxial structure 500A formed on a patterned substrate. There is shown a crystalline template layer 104 as described with reference to FIGS. 1 to 4. The crystalline template layer 104 is patterned using known techniques to deposit a mask 502. Whilst the mask 502 is shown in cross section, the skilled person understands that the mask 502 is formable in two dimensions to provide an array of apertures on the crystalline template layer. The mask 502 is formed using silicon dioxide. In further examples, the mask 502 is alternatively and/or additionally formed using further materials. Overgrowth 504 of n-type GaN on the masked crystalline template layer results in the overgrowth 504 forming a structures of GaN in electrical communication with the n-type GaN crystalline template layer 104. The overgrowth 504 is shown to form trapezoidal cross section structures in FIG. 5A, however, the skilled person understands that the morphology of such overgrowth 504 extends to 3 dimensions and is related to the underlying crystalline structure of the material used for overgrowth 504 structures. Once grown, the overgrowth 504 structures form part of the crystalline template layer 104.

The dimensions of the trapezoidal overgrowth 504 structures described with respect to FIGS. 5A and 5B vary as a function of the trapezoidal pyramid height. The lateral dimension of the trapezoidal features is of the order of 4 μm at the base of the trapezoidal feature and of the order of 3 μm at the top of the trapezoidal feature, for a height of approximately 1 μm. In further examples, the lateral dimensions of the trapezoidal features are controlled to provide alternative or additional features of different sizes. In further examples, the dimensions of the overgrowth 504 features are controlled to provide laterally sized islands in the second epitaxial crystalline layer 108 suitable for the formation of microLED devices with pixel dimensions of the order of between 1 µm and 10 µm. Alternatively, or additionally, island domains in the second epitaxial crystalline layer 108 with lateral dimensions less than 1 µm are provided. Advantageously, the formation of two dimensional islands in the second epitaxial crystalline layer 108 based on such lithographic patterning and overgrowth provides strain relaxed islands with lateral dimensions of the order of 1 µm to 10 µm, or less. Such formation of islands is highly controllable and provides relaxed island domains comparable with the size of devices that are formable on the relaxed islands domains, such as micro LED devices with a pixel size of the order of 1 µm to 10 µm.

Once the overgrowth 504 structures have been formed, an initially highly doped first epitaxial crystalline layer 106, such as that described with reference to FIGS. 1 to 4, is formed. The first epitaxial crystalline layer 106 is formed on the top and the sidewalls of the overgrowth 504 formed in the apertures of the mask 502. The thickness of the first epitaxial crystalline layer 106 on the top of the overgrowth 504 features is approximately 30 nm. The growth rates of crystalline materials on different crystalline planes, such as those provided by the top and sidewalls of the overgrowth 504 structures may be different and can be controlled by altering the growth rate of crystalline material, as well as the composition of the crystalline material, for example. Therefore, the thickness of crystalline layer deposited on the different faces of the overgrowth 504 structures may be different. The thickness of the first epitaxial crystalline layer 106 and the second epitaxial crystalline layer 108 are described above with respect to the thickness of layers generally perpendicular to the underlying planar substrate (and therefore parallel to the primary growth direction). Where the thickness of the first epitaxial crystalline layer 106 on the top of the overgrowth 504 features is approximately 30 nm, the thickness of the first epitaxial crystalline layer 106 on the sidewalls of the overgrowth 504 features is of the order of 1 to 3 nm. In further examples, the thickness of the first epitaxial crystalline layer 106 on the sidewalls is a different thickness. Beneficially, the relatively thinner first epitaxial crystalline layer 106 on the sidewalls of the overgrowth 504 features means that the first epitaxial crystalline layer 106 on the sidewalls of the overgrowth 504 features can be etched off straightforwardly, as described below, in order to provide a channel to the underlying n-GaN.

Subsequently, a second epitaxial crystalline layer 108, such as that described with reference to FIGS. 1 to 4 is formed on the first epitaxial crystalline layer 106. As described above with reference to FIGS. 1 to 4, the second epitaxial crystalline layer 108 is initially strained by the underlying material of the crystalline template layer 104 and the first epitaxial crystalline layer 106 such that the different inherent, natural, in-plane lattice parameter of the second epitaxial crystalline layer 108 is pseudomorphically aligned with the inherent, natural, in-plane lattice parameter of the first epitaxial crystalline layer 106. The second epitaxial crystalline layer 108 has a thickness of between 100 nm and 150 nm on top of the overgrowth 504 features. As described above with respect to the first epitaxial crystalline layer 106 in FIG. 5A, the growth rates of crystalline materials on different crystalline planes, such as those provided by the top and sidewalls of the overgrowth 504 structures may be different. Where the thickness of the second epitaxial crystalline layer 108 on the top of the overgrowth 504 features is approximately 100 to 150 nm, the thickness of the second epitaxial crystalline layer 108 on the sidewalls of the overgrowth 504 features is of the order of 5 to 20 nm. In further examples, the thickness of the second epitaxial crystalline layer 108 on the sidewalls is a different thickness.

Electrochemical etching of the epitaxial structure 500A results in porosification of the first epitaxial crystalline layer 106 through threading dislocations or other openings in the undoped InGaN of the second epitaxial crystalline layer 108 enabling such electrochemical processing of the subsurface first epitaxial crystalline layer 106 to take place. This is facilitated by the high doping contrast between the n-type crystalline template layer 104 and first epitaxial crystalline layer 106 meaning that only the first epitaxial crystalline layer 106 becomes porosified during an electrochemical etching of this layer. Advantageously, the doping contrast enables control of the porosification process since, as the first epitaxial crystalline layer 106 has pores formed in it, the porosified first epitaxial crystalline layer 106' becomes highly resistive and therefore the electrochemical process used to porosify the first epitaxial crystalline layer 106 stops forming pores. The porosified first epitaxial crystalline layer 106' is shown at FIG. 5B.

FIG. 5B shows an epitaxial structure 500B that is the structure 500A of FIG. 5A that has been processed further to provide an array of light emitting structures. There is shown the porosified first epitaxial crystalline layer 106' formed on the top of the overgrowth 504 structures and the second epitaxial crystalline layer 108 formed on the porosified first epitaxial crystalline layer 106'. The porosification of the first epitaxial crystalline layer 106 results in the removal of material in the channels between overgrowth 504 structures from the sidewalls of the overgrowth 504 structures. In further examples, material from the sidewalls of the overgrowth 504 structures is removed by different means to form channels through the porosified first epitaxial crystalline layer 106' and the second epitaxial crystalline layer 108 to form a path through layers 106', 108 to the n-type GaN of the overgrowth 504 structures of GaN formed on the crystalline template layer 104. Beneficially, in GaN based structures, such as the epitaxial structures 500A, 500B described with reference to FIGS. 5A and 5B, the growth direction is typically perpendicular to the c-plane and the etching rate of inclined facets, such as the sidewalls of the overgrowth 504 structures is faster than that of the c-plane material, such as that formed on the top of the overgrowth 504 structures. This means that the porosified first epitaxial crystalline layer 106' and the second first epitaxial crystalline layer 108 can be etched from the sidewalls of the overgrowth 504 structures at a faster rate than the material formed on top of the overgrowth 504 structures is etched. Accordingly, removal of material to form channels to the n-GaN through the porosified first epitaxial crystalline layer 106' and the second epitaxial crystalline layer 108 is facilitated.

Removal of the porosified first epitaxial crystalline layer 106' and the second epitaxial crystalline layer 108 effectively creates 2 dimensional domains or islands in the second epitaxial crystalline layer 108. The porosification of the first epitaxial crystalline layer 106 enables strain relaxation in the second epitaxial crystalline layer 108 of undoped InGaN. Such strain relaxation requires the second epitaxial crystalline layer 108 to expand. The lateral expansion of the second epitaxial crystalline layer 108 is controlled in order to provide advantageous structures, as described herein. The extent to which the porosified first epitaxial crystalline layer 106' is, by density of volume, pore and GaN material, depends on the electrochemical etching process. The electrochemical etching process, whilst beneficially providing compliant material in a subsurface layer, results in the porosified first epitaxial crystalline layer 106' having a reduced electrical conductivity compared with the highly doped conductivity of the first epitaxial crystalline layer 106 when initially formed. Beneficially, removal of the porosified first epitaxial crystalline layer 106' and the second epitaxial crystalline layer 108 effectively to create 2 dimensional domains or islands in the second epitaxial crystalline layer 108 also creates channels for the electrical connection of subsequently grown layers on grown on the second epitaxial crystalline layer 108 with the crystalline template layer 104.

A further layer 506, analogous to the further layers 212, 414 described above with respect to FIGS. 2 to 4 is conformally deposited and formed on the relaxed second epitaxial crystalline layer 108. The further layer 506 is an active region. The further layer 506 includes one or more quantum wells, such as InGaN based quantum wells designed to emit light with a primary wavelength of light corresponding to red light upon carrier injection and recombination. In further examples, the further layer 506 comprises additional and/or alternative layers that benefit from formation on the relatively relaxed second epitaxial crystalline layer 108. The further layer 506 is a third epitaxial crystalline layer that provides a channel for electrical conductivity from the n-GaN overgrowth 504 forming part of the crystalline template layer 104 to the portion of the active region formed on the relaxed second epitaxial crystalline layer 108.

Upon the further layer 506 there is formed a p-type region 508. The p-type region 508 is conformally deposited and formed on the further layer 506 on the top of the overgrowth 504 structures and on the sidewalls of the overgrowth 504 structures. The p-type region 508 is formed from p-type doped GaN. In further examples, additional and/or alternative layers are used to form the p-type region 508.

Advantageously, the structure 500B of FIG. 5B provides an array of light emitting diode structures with active regions formed on relatively strain relaxed layers with lattice constants closer to the lattice constant of the material forming the active region, thereby to provide high quality light emitting regions with improved efficiency. The formation of such active regions on overgrowth 504 structures improves light extraction from devices based on such high quality light emitting regions and improves collimation.

Beneficially, where the third epitaxial layer forming electrical connection through the porosified first epitaxial crystalline layer 106' and the second epitaxial crystalline layer 108 forms part of an active region on one or more sidewalls of one or more of the overgrowth 504 structures, a direct current path for electrons between the crystalline template layer 104 and the active region of the further layer 506 on the island of the second epitaxial crystalline layer 108 is provided. Advantageously, such injection is controlled and sidewall injection enables a reduced forward voltage for multiple quantum well (MQW) structures forming part of the further layer 506 where there is a high operating current.

Whilst FIG. 5B shows the mask 502, in further examples the mask 502 is removed after the overgrowth 504 step. Further, whilst the further layer 506 and the p-type region 508 are conformally formed on the overgrowth 504 structures, individual structures are optionally disconnected thereby to enable the formation of multiple, individually addressable light emitting diode structures with a common n-type electrode formed by the crystalline template layer 104.

Advantageously, the techniques and structures described herein provide a way of forming a relatively strain relaxed layer upon a conductive template layer whilst enabling electrical connection between the conductive template layer and layers subsequently grown on the relatively strain relaxed layer. Advantageously, where an epitaxial crystalline layer with an inherent in-plane lattice parameter that is different to the inherent in-plane lattice parameter of a crystalline template layer is formed on an intervening layer such that the epitaxial crystalline layer is pseudomorphically formed with respect to the intervening layer, porosification of the intervening layer in conjunction with the formation of channels through the porosified intervening layer and the epitaxial crystalline layer enables strain relaxation in the epitaxial crystalline layer as well as a route for current injection in devices formed on the relaxed epitaxial crystalline layer.

Beneficially, channels formed and filled with material to enable electrical connection overcome difficulties associated with the use of highly resistive layers used for strain relaxation and hence the provision of functioning devices. Advantageously, the use of channels with faces angled with respect to the direction perpendicular to the planar growth direction of epitaxial layers provides for sloped surfaces upon which connection can be made to underlying crystalline template layers whilst simultaneously providing strain relaxed light emitting structures on disconnected islands of relatively strain relaxed material that has a different inherent in-plane lattice parameter to the inherent in-plane lattice parameter of the crystalline template layer above which the relatively strain relaxed material is formed.

Beneficially, light emitting diode (LED) devices can be formed on the structures described with reference to FIGS. 1 to 5. Advantageously, arrays of LEDs with associated pixels can be formed on the strain relaxed layers whilst enabling n-type contact through the n-type region even though the strain relaxation uses a porous layer that is highly resistive. This avoids the need to form conductive layers of material and the formation of contacts for both p-type and n-type layers in LED devices from the same side of the device. This is particularly advantageous, for example, in respect of longer wavelength InGaN based light emitting devices, such as LEDs formed from nitride material configured to emit light with a primary peak wavelength that corresponds to red light, where a strain relaxed islands of undoped InGaN can be used instead of thicker, conducting layers of InGaN which are typically of poor quality. Further, enabling conduction to make n-type contacts on the opposite side of the device from the p-type contact means that pixels associated with LED devices in arrays can be packed more closely, thereby improving the resolution of display devices based on such arrays.

Whilst the processes described herein are given in a particular order, the skilled person understands that in further examples, alternative and/or additional steps and process orders are implemented whilst enabling the functionality provided.

The invention claimed is:
1. A method of forming a strain relaxation layer in an epitaxial crystalline structure, the method comprising:
   providing a crystalline template layer comprising a material with a first natural relaxed in-plane lattice parameter;
   forming a first epitaxial crystalline layer on the crystalline template layer, wherein the first epitaxial crystalline layer has an initial electrical conductivity that is higher than the electrical conductivity of the crystalline template layer;

forming a second epitaxial crystalline layer on the first epitaxial crystalline layer, wherein the second epitaxial crystalline layer has an electrical conductivity lower than the initial electrical conductivity of the first epitaxial crystalline layer and comprises a material with a second natural relaxed in-plane lattice parameter that is different to the first natural relaxed in-plane lattice parameter of the crystalline template layer;

forming pores in the first epitaxial crystalline layer by electrochemical etching of the first epitaxial crystalline layer to enable strain relaxation in the second epitaxial crystalline layer by plastic deformation of bonds in the first epitaxial crystalline layer and/or at the interface between the first epitaxial crystalline layer and the second epitaxial crystalline layer; and forming one or more channels comprising a conductive material through at least the first epitaxial crystalline layer and the second epitaxial crystalline layer thereby to enable electrical connection to the crystalline template layer through the first epitaxial crystalline layer and the second epitaxial crystalline layer.

2. The method according to claim 1, wherein the pores are formed with a density of the volume of the first epitaxial layer between the crystalline template layer and the second epitaxial crystalline layer of greater than 50%, preferably greater than 60% and more preferably greater than 70%.

3. The method according to claim 1, wherein the second epitaxial crystalline layer comprises at least one V-pit, preferably wherein the depth of the at least one V-pit is substantially the thickness of the first epitaxial crystalline layer and the second epitaxial crystalline layer combined.

4. The method according to claim 3, comprising enlarging the at least one V-pit, preferably wherein enlarging the at least one V-pit comprises etching material from at least one sidewall of the at least one V-pit thereby to expose at least a portion of the crystalline template layer.

5. The method according to claim 1, comprising etching through at least the second epitaxial crystalline layer thereby to form one or more islands in the second epitaxial crystalline layer, preferably comprising patterning the second epitaxial crystalline layer, wherein patterning comprises at least one of a lithographic technique and a self-assembled Ni hard mask.

6. The method according to claim 1, comprising forming the crystalline template layer on a patterned template layer.

7. The method according to claim 6, wherein the patterned template layer is patterned to provide trenches, preferably wherein forming the crystalline template layer comprises forming overgrowth material in the trenches to provide V-grooves, thereby to enable the formation of two dimensional domains at least partially defined by valleys in the second epitaxial crystalline layer.

8. The method according to claim 6, wherein the crystalline template layer is patterned to provide one or more overgrowth structures, preferably wherein forming the patterned template layer comprises at least partially masking the crystalline template layer to provide one or more apertures and forming overgrowth material in the one or more apertures thereby to provide the one or more overgrowth structures, preferably wherein forming the one or more channels comprising the conductive material through at least the first epitaxial crystalline layer and the second epitaxial crystalline layer comprises removing material from one or more sidewalls of the one or more overgrowth structures.

9. The method according to claim 1, comprising planarizing at least a portion of the second epitaxial crystalline layer thereby to form a third epitaxial crystalline layer that is pseudomorphic with the second epitaxial crystalline layer, preferably wherein the conductive material forms part of the third epitaxial crystalline layer.

10. The method according to claim 9, wherein the third epitaxial crystalline layer is an electrically conductive layer, preferably wherein the third epitaxial crystalline layer is in electrical communication with the crystalline template layer and/or wherein the third epitaxial crystalline layer forms at least part of an active region configured to emit light in response to carrier recombination.

11. The method of claim 9, wherein at least one of the crystalline template layer, the first epitaxial crystalline layer, the second epitaxial crystalline layer and the third epitaxial crystalline layer comprises a semiconductor material, preferably wherein the semiconductor material is a III-V based material, more preferably wherein the III-V based material is a nitride based material.

12. An epitaxial crystalline structure comprising:
a crystalline template layer comprising a material with a first natural relaxed in-plane lattice parameter;
a first epitaxial crystalline layer formed on the crystalline template layer;
a second epitaxial crystalline layer formed on the first epitaxial crystalline layer, wherein the second epitaxial crystalline layer comprises a material with a second natural relaxed in-plane lattice parameter that is different to the first natural relaxed in-plane lattice parameter of the crystalline template layer;
one or more pores formed in the first epitaxial crystalline layer such that any strain in the second epitaxial crystalline layer is relaxed by plastic deformation of bonds in the first epitaxial crystalline layer and/or at the interface between the first epitaxial crystalline layer and the second epitaxial crystalline layer; and
one or more channels comprising a conductive material formed through at least the first epitaxial crystalline layer and the second epitaxial crystalline layer thereby to enable electrical connection to the crystalline template layer through the first epitaxial crystalline layer and the second epitaxial crystalline layer.

13. The epitaxial crystalline structure according to claim 12, comprising a third epitaxial crystalline layer that is pseudomorphic with the second epitaxial crystalline layer.

14. The epitaxial crystalline structure according to claim 13, wherein the conductive material forms part of the third epitaxial crystalline layer.

15. The epitaxial crystalline structure according to claim 12, wherein the one or more pores are formed with a density of the volume of the first epitaxial layer between the crystalline template layer and the second epitaxial crystalline layer of greater than 50%, preferably greater than 60% and more preferably greater than 70%.

16. The epitaxial crystalline structure according to claim 12, wherein the second epitaxial crystalline layer comprises at least one V-pit, preferably wherein the depth of the at least one V-pit is substantially the thickness of the first epitaxial crystalline layer and the second epitaxial crystalline layer combined.

17. The epitaxial crystalline structure according to claim 16, wherein the at least one V-pit exposes at least a portion of the crystalline template layer.

18. The epitaxial crystalline structure according to claim 12, comprising one or more islands formed in the second epitaxial crystalline layer, and comprising one or more valleys at least partially surrounding the one or more islands in the second epitaxial crystalline layer thereby to enable the formation of one or more two dimensional domains.

19. The epitaxial crystalline structure according to claim 12, wherein the third epitaxial crystalline layer is an electrically conductive layer, preferably wherein the third epitaxial crystalline layer is in electrical communication with the crystalline template layer and/or wherein the third epitaxial crystalline layer forms part of an active region configured to emit light in response to carrier recombination.

20. A light emitting device comprising the epitaxial crystalline structure according to claim 12.

* * * * *